United States Patent [19]

Alexander

[11] 4,047,127

[45] Sept. 6, 1977

[54] RF OSCILLATOR AND MODULATOR HAVING REGULATED LOW HARMONIC OUTPUT

[75] Inventor: Wilson E. Alexander, Santa Clara, Calif.

[73] Assignee: Fairchild Camera and Instrument Corporation, Mountain View, Calif.

[21] Appl. No.: 718,279

[22] Filed: Aug. 27, 1976

[51] Int. Cl.² .................................................. H03C 1/14
[52] U.S. Cl. .............................. 332/31 T; 331/117 R; 331/186; 332/53
[58] Field of Search .......................... 331/117 R, 186; 332/31 R, 31 T, 53

[56] References Cited

U.S. PATENT DOCUMENTS

| | | | |
|---|---|---|---|
| 3,229,227 | 1/1966 | Popodi | 331/117 |
| 4,003,000 | 1/1977 | Sordello et al. | 331/117 |

*Primary Examiner*—Siegfried H. Grimm
*Attorney, Agent, or Firm*—Alan H. MacPherson; Henry K. Woodward; Norman E. Reitz

[57] ABSTRACT

An RF oscillator and modulator produces a stable moudlated RF signal with a varying voltage source and without the requirement for critical device selection. A bias voltage for the oscillator transistor is provided by diode means at the oscillator output, the bias voltage being commuted to the transistor through the oscillator tuned circuit. Advantageously, the diode means biases a diode modulator connected to the oscillator output and to a modulation signal whereby linear operation of the diode modulator is enhanced.

7 Claims, 1 Drawing Figure

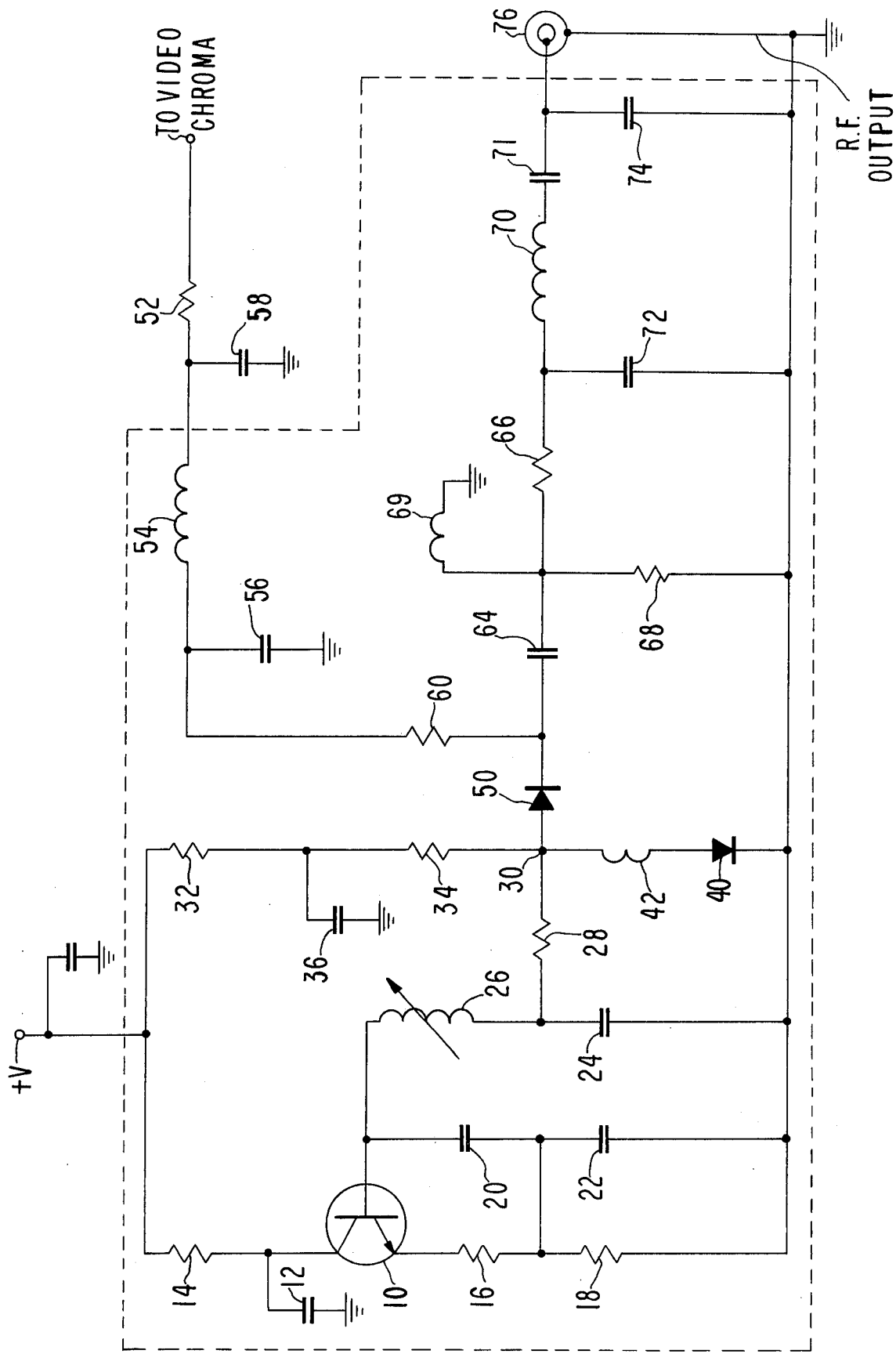

4,047,127

RF OSCILLATOR AND MODULATOR HAVING REGULATED LOW HARMONIC OUTPUT

BACKGROUND OF THE INVENTION:

1. Field of the Invention

This invention relates generally to electrical circuits and more particularly to electrical oscillators and modulators for ratio frequency (RF) operation.

2. Prior Art

RF oscillators and modulators for use in home and commercial appliances typically must meet certain requirements in power and frequency output. For example, appliances such as video games which may be operated with conventional television receivers, must comply with FCC regulations on harmonic surpession and maximum output voltage to minimize spurious signal propagation.

Conventional circuits often require regulated voltage supplies and specific device parameters to comply with these Federal regulations. Consequently, manufacturing costs of the circuits are increased significantly.

SUMMARY OF THE INVENTION

An object of the present invention is an RF oscillator and modulator circuit which can meet specific output requirements with reduced costs of manfacturing.

Briefly, an RF oscillator, in accordance with the present invention, includes biasing means at the oscillator output for generating a bias voltage which is commuted to an oscillator transistor whereby output power is regulated for a range of supply voltages. The biasing means comprises one or more diodes which are selected to have a temperature coefficient which closely matches that of the oscillator transistor whereby proper transistor bias is maintained over an operating temperature range.

A diode modulator may be connected between the oscillator output and moduation signal source to generate a modulated RF signal. Advantageously, the biasing diode for the oscillator transistor also provides an RF bias for the diode modulator.

The invention and objects and features thereof will be more readily apparent from the following detailed description and appended claims when taken with the drawing.

BRIEF DESCRIPTION OF THE DRAWING

The drawing is an electrical schematic of an RF oscillator and modulator in accordance with the invention.

DESCRIPTION OF ILLUSTRATED EMBODIMENT

Referring to the drawing, an RF oscillator in accordance with the invention comprises transistor 10 which is connected in a grounded collector Colpitts configuration. A DC supply voltage which in accordance with the invention may vary from 5 to 15 volts is connected through resistor 14 to the collector of transistor 10, and the emitter of transistor 10 is connected through a resistive voltage divider comprising resistors 16 and 18 to circuit ground. The base of transistor 10 is connected to the tuned circuit comprising capacitors 20, 22, 24 and variable inductor 26 which is a bridge configuration with the common terminal of capacitor 24 and inductor 26 connected through resistor 28 to the oscillator output terminal 30. The DC voltage supply is connected through resistor 32 and resistor 34 to output terminal 30, with capacitor 36 providing an RF shunt to ground.

Advantageously, biasing means comprising diode 40 is connected between the oscillator output 30 and circuit ground which produces a DC bias voltage at output terminal 30 which is transmitted through the tuned circuit to the base of transistor 10. The voltage drop across diode 40 does not fluctuate for a supply voltage ranging from approximately 5 volts to 15 volts; thus, the bias on transistor 10 remains constant over this supply voltage range and the oscillator output power remains substantially constant.

In this illustrative embodiment a small length of transmission line 42 is serially connected with diode 40 between the output terminal 30 and circuit ground to increase the RF impedance at the oscillator output. Connected to output terminal 30 is the anode of a modulator attenuator diode 50, with the cathode of modulator diode 50 connected to receive a modulation signal at the cathode. In the illustrative embodiment the modulation signal is video chroma which is applied through resistor 52 and a 3 pole Tshebyscheff filter comprising inductor 54, and shunt capacitors 56, 58, and serially through resistor 60 to the modulator diode cathode. At small current levels the resistance of diode 50 varies as a reciprocal of current level with a resulting attenuation-modulation of the oscillator output signal.

The modulated output signal taken at the cathode of diode 50 is applied through a network comprising serially connected capacitor 64 and resistor 66, and shunt resistor 68 to a low pass filter comprising serially connected inductor 70 and capacitor 71 and shunt capacitors 72, 74, to the modulated RF output at 76. In a video game application, for example, the output 76 is connected directly to the antenna of a conventional TV receiver for game operation. Transmission line 69 is provided as a shorted stub to filter out video frequencies while passing the modulated RF signal.

The oscillator bias in accordance with the present invention allows the oscillator output power to be independent to supply voltage over a relatively wide voltage range, (e.g. 5–15 volts). Harmonic output of the tuned oscillator is low; the measured second harmonic frequency is one embodiment was minus 55 DB at the oscillator output. And, importantly, output power is low and relatively independent of choice of oscillator transistor. Output power variation was found to be plus or minus 1.5 DB with a number of randomly chosen transistors of various transistor families used in the oscillator.

In a preferred embodiment the biasing diode 40 is a light emitting diode having a temperature coefficient closely matching that of an oscillator transistor. An LED typically provides a reference voltage of 1.65 volts and the DC emitter current to the oscillator transistor may be controlled to 1.0 mA. With sinusoidal voltages assumed, the maximum RF voltage from emitter to ground for the oscillator transistor will be 2.0 volt peak-to-peak. Because the emitter voltage is restricted, the emitter to collector voltage never goes below 2.8 volt during the RF cycle, thus preventing transistor saturation and subsequent RF clipping and harmonic generation. The biasing diode may also comprise two or more forward biased serially connected diodes. Alternatively, a reversed biased Zener diode may be employed if a higher supply voltage is provided for the oscillator.

In one specific embodiment, the following device values were used:

| | | | |
|---|---|---|---|
| 10 | MPS 3563 | 26 | .3 - .5 μH |
| 12 | .001 μf | 28 | 68 Ω |
| 14 | 220 Ω | 32 | 270 Ω |
| 16 | 39 Ω | 34 | 270 Ω |
| 18 | 1 K Ω | 36 | .1 μF |
| 20 | 100 Pf | 40 | FLV 110 |
| 22 | 18 Pf | 42 | 110 Ω Transmission Line |
| 24 | 220 Pf | 50 | 1N4148 |
| 52 | 470 Ω | 66 | 56 Ω |
| 54 | 15 μH | 68 | 27 Ω |
| 56 | 220 Pf | 70 | .68 μH |
| 58 | 220 Pf | 71 | 12 Pf |
| 60 | 470 Ω | 72 | 33 Pf |
| 64 | 220 Pf | 74 | 33 Pf |

In the above described specific embodiment the oscillator delivered minus 14 DBm to the modulator diode. The modulator diode is 75 Ohm attenuator with a attenuation which can be varied from 35 DB to greater than 50 DB with the attenuation being varied by changing the current through the modulator diode. In a video game application, at the sync tip (highest amplitude signal) the diode current is about 1 mA which results in a diode resistance of 25 Ohm. At a reference white level, the diode current is 0.1 mA which results in a diode resistance of 250 Ohm. The diode impedance is larger than the source and load impedance, thus the amplitude of the RF voltage approaches a linear function of diode current. The second harmonic spurious output for a 3.58 Mhz modulation signal is minus 40 DB.

The described oscillator and modulator has proved to be efficient and economical in meeting Federal requirements for use in video games. It will be readily appreciated to those skilled in the art that the advantages of the circuit and modifications thereof can be utilized in other applications. While the invention has been described with reference to a specific embodiment, the description is illustrative and is not to be construed as limiting the scope of the invention. Various modifications and applications will occur to those skilled in the art without departing from the true spirit and scope of the invention as defined by the appended claims.

I claim:

1. An RF oscillator and modulator wherein said oscillator has a regulated output power for a range of supply voltage and low harmonic voltage output comprising:
   a. a bipolar transistor having emitter, base and collector terminals,
   b. a voltage source,
   c. means connecting said transistor to said voltage source;
   d. means connecting said transistor to circuit ground;
   e. tuned circuit means operably connected with said transistor to establish oscillation frequency;
   f. means interconnecting said tuned circuit means and an oscillator output terminal;
   g. diode biasing means having a fixed DC voltage drop connecting said output terminal and circuit ground whereby said fixed DC voltage is commuted to said transistor through said tuned circuit as a bias voltage and
   h. modulation means connected to said oscillator output terminal for receiving a modulation signal and modulating said oscillator signal.

2. An RF oscillator and modulator as defined in claim 1 wherein said diode biasing means comprises a light emitting diode.

3. An RF oscillator and modulator as defined by claim 1 wherein said diode biasing means comprises a plurality of serially connected, forward biased diodes.

4. An RF oscillator and modulator as defined in claim 1 wherein said diode biasing means comprises a reversed biased Zener diode.

5. An RF oscillator and modulator as defined in claim 1 wherein said means connecting said transistor to said voltage source comprises capacitive means connecting said collector terminal to circuit ground and resistive means connecting said collector terminal to said voltage source; said means connecting said transistor to circuit ground comprises a resistive voltage divider; and said tuned circuit is connected to said base terminal and to said resistive voltage divider.

6. An RF oscillator and modulator as defined by claim 1 wherein said modulation means comprises a diode having an anode connected to said oscillator output terminal and a cathode connected to receive said modulation signal and produce said modulated signal.

7. An RF oscillator and modulator as defined by claim 6 and further including filter means connecting said diode cathode to a modulated RF output terminal.

* * * * *